United States Patent
Lee et al.

(10) Patent No.: US 9,035,192 B2
(45) Date of Patent: May 19, 2015

(54) ANISOTROPIC CONDUCTIVE ADHESIVE COMPOSITE AND FILM, AND CIRCUIT CONNECTING STRUCTURE INCLUDING THE SAME

(75) Inventors: Gyu Ho Lee, Uiwang-si (KR); Young Woo Park, Uiwang-si (KR); Il Rae Cho, Uiwang-si (KR); Young Hun Kim, Uiwang-si (KR); Kyoung Soo Park, Uiwang-si (KR); Jin Seong Park, Uiwang-si (KR); Dong Seon Uh, Uiwang-si (KR); Kyung Jin Lee, Uiwang-si (KR); Kwang Jin Jung, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 204 days.

(21) Appl. No.: 12/974,476

(22) Filed: Dec. 21, 2010

(65) Prior Publication Data
US 2011/0155430 A1 Jun. 30, 2011

(30) Foreign Application Priority Data
Dec. 24, 2009 (KR) .................. 10-2009-0131246

(51) Int. Cl.
| | |
|---|---|
| H05K 1/09 | (2006.01) |
| C09J 11/04 | (2006.01) |
| C09J 9/02 | (2006.01) |
| H05K 3/32 | (2006.01) |
| C08K 3/00 | (2006.01) |
| C08K 9/02 | (2006.01) |

(52) U.S. Cl.
CPC ............... *C09J 11/04* (2013.01); *C08K 3/0066* (2013.01); *C08K 9/02* (2013.01); *C09J 9/02* (2013.01); *H05K 3/323* (2013.01); *H05K 2201/0218* (2013.01)

(58) Field of Classification Search
CPC ....... H05K 3/102; H05K 1/092; H05K 1/095; H05K 1/0313; H01L 21/02601
USPC .......................... 174/257, 250–256, 259, 268
See application file for complete search history.

(56) References Cited

U.S. PATENT DOCUMENTS

| | | | | |
|---|---|---|---|---|
| 5,928,568 | A * | 7/1999 | Paszkiet et al. | 252/512 |
| 8,075,949 | B2 * | 12/2011 | Suzuki et al. | 427/216 |
| 2004/0052932 | A1 * | 3/2004 | Yazaki et al. | 427/96 |
| 2008/0160309 | A1 * | 7/2008 | Kubota | 428/403 |
| 2010/0085720 | A1 * | 4/2010 | Shudo | 361/792 |
| 2012/0153008 | A1 | 6/2012 | Shudo | |

FOREIGN PATENT DOCUMENTS

| | | |
|---|---|---|
| CN | 1297688 | 1/2007 |
| JP | 2003-045228 | 2/2003 |

(Continued)

OTHER PUBLICATIONS

Korean Office Action dated Jun. 18, 2012.
(Continued)

*Primary Examiner* — Tremesha S Willis
(74) *Attorney, Agent, or Firm* — Lee & Morse, P.C.

(57) ABSTRACT

An anisotropic conductive adhesive composite and film include a binder and conductive particles dispersed in the binder. The conductive particles include a copper core particle and a metal coating layer coated on a surface of the corresponding copper core particle.

19 Claims, 2 Drawing Sheets

(56) References Cited

FOREIGN PATENT DOCUMENTS

| | | |
|---|---|---|
| KR | 10-2002-0021238 A | 3/2002 |
| KR | 10-2009-0131246 A | 12/2009 |
| TW | 200949396 A | 12/2009 |

OTHER PUBLICATIONS

Taiwanese Office Action and Search Report dated Jul. 29, 2013.
Taiwanese Office Action dated Mar. 27, 2014.

\* cited by examiner ns, such as semiconductor devices to substrates, in electronic products like liquid crystal displays (LCDs) and handheld communication devices. Further, the adhesives may be used for connection of high current, high voltage, and fine pitch electrodes in liquid crystal display televisions, mobile phones, plasma display panels (PDPs), electroluminescent (EL) panels, etc. Recent development of small-sized electronic devices and components has lead to an increased demand for electrical circuit connection between electrodes using adhesives.

ANISOTROPIC CONDUCTIVE ADHESIVE COMPOSITE AND FILM, AND CIRCUIT CONNECTING STRUCTURE INCLUDING THE SAME

BACKGROUND

1. Field

Embodiments relate to anisotropic conductive composites, to anisotropic conductive adhesive composites and films, and a circuit connecting structure including the same.

2. Description of the Related Art

Adhesives may be used to connect small electrical components, such as semiconductor devices to substrates, in electronic products like liquid crystal displays (LCDs) and handheld communication devices. Further, the adhesives may be used for connection of high current, high voltage, and fine pitch electrodes in liquid crystal display televisions, mobile phones, plasma display panels (PDPs), electroluminescent (EL) panels, etc. Recent development of small-sized electronic devices and components has lead to an increased demand for electrical circuit connection between electrodes using adhesives.

SUMMARY

Embodiments are therefore directed to an anisotropic conductive adhesive composite, an anisotropic conductive adhesive film, and a circuit connecting structure including an anisotropic conductive adhesive.

An embodiment is directed to an anisotropic conductive film, including a binder, and conductive particles dispersed in the binder, the conductive particles including a copper core particle and a metal coating layer coated on a surface of the copper core particle.

The binder may include an organic resin, an amount of the organic resin being about 99.9 to 80 wt % based on a total weight of the anisotropic conductive film, and an amount of the conductive particles may be about 0.1 to 20 wt % based on the total weight of the anisotropic conductive film.

The metal coating layer may include a silver (Ag) coating layer.

The silver coating layer may have an island shape that partially exposes the surface of the corresponding copper core particle, the island shape being formed through electroless plating.

A total amount of the silver coating layer may be about 8 wt % to about 9 wt % based on a total weight of the conductive particles.

The conductive particles may include copper core particles that are spherical particles having an average particle size of about 2 to about 20 µm, the copper core particles being formed by chemical precipitation.

The conductive particles may include copper core particles having an average particle size of about 2 to about 20 µm, the copper core particles being formed by atomizing.

The conductive particles may include rust protection layers on the surfaces thereof, the rust protection layers being formed by a rust protection treatment including an stearic acid.

Another embodiment is directed to a anisotropic conductive adhesive composite, including a binder, and conductive particles dispersed in the binder, the conductive particles including a copper core particle and a metal coating layer coated a on surface of the copper core particle.

The conductive particles may include rust protection layers on surfaces thereof, the rust protection layers being formed by a rust protection treatment including stearic acid.

The metal coating layer may includes a silver (Ag) coating layer.

The silver coating layer may have an island shape that partially exposes the surface of the corresponding copper core particle, the island shape being formed through electroless plating.

A total amount of the silver coating layer may be about 8 wt % to about 9 wt % based on a total weight of the conductive particles.

An embodiment is directed to a circuit connection structure, including a circuit substrate including a circuit electrode, a wire substrate facing the circuit substrate and including a wire electrode, and an anisotropic conductive film configured to provide an electrical connection between the circuit electrode and the wire electrode. The anisotropic conductive film may include a binder and conductive particles dispersed in the binder, the conductive particles including a copper core particle and a metal coating layer coated on a surface of the corresponding copper core particle.

The wire electrode may include copper corresponding to the copper core particle.

The circuit electrode may include silver (Ag), tin (Sn), gold (Au), titanium (Ti), molybdenum (Mo), aluminum (Al) or bismuth (Bi) corresponding to the metal coating layer, and the metal coating layer may include silver (Ag), tin (Sn), gold (Au), titanium (Ti), molybdenum (Mo), aluminum (Al) or bismuth (Bi) corresponding to the circuit electrode.

The metal coating layer may have an island shape that partially exposes the surface of the corresponding copper core particle, the island shape being formed through electroless plating.

The wire electrode may include copper, the circuit electrode may include silver, and the metal coating layer may include silver, such that at least one copper core particle is adhered to the wire electrode and at least one metal coating layer is adhered to the circuit electrode.

The metal coating layer may include silver, and a total amount of the silver in the metal coating layer may be about 8 wt % to about 9 wt % based on a total weight of the conductive particles.

At least one conductive particle may be disposed between the circuit electrode and the wire electrode, and the copper core particle of the at least one conductive particle may be deformed.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
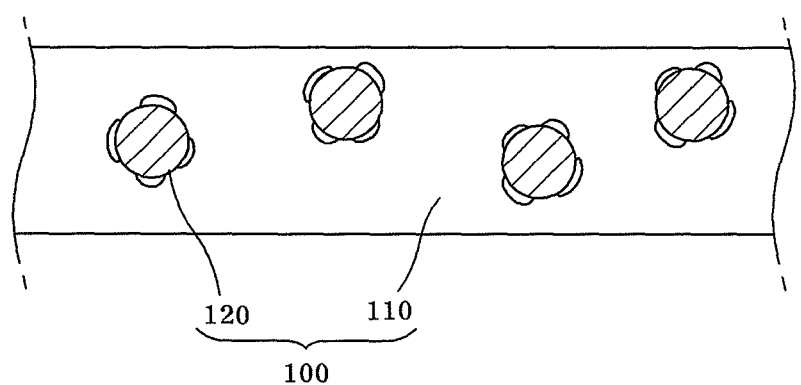
FIG. 1 illustrates an anisotropic conductive material, according to an exemplary embodiment.

Korean Patent Application No. 10-2009-0131246, filed on Dec. 24, 2009, in the Korean Intellectual Property Office, and entitled: "Anisotropic Conductive Adhesive Composite and Film, and Circuit Connecting Structure Comprising the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or element, it can be directly on the other layer or substrate, or intervening layers may also be present. Further, it will also be understood that when a layer is referred to as being "between" two layers, it can be the only layer between the two layers, or one or more intervening layers may also be present. Like reference numerals refer to like elements throughout.

Anisotropic conductive adhesives may be provided to form an electrical connection. The anisotropic conductive adhesives may be in the form of anisotropic conductive pastes, anisotropic conductive composites, or anisotropic conductive films. The anisotropic conductive adhesives may be used to realize a circuit connecting structure through electrical connection between, e.g., electrodes. The anisotropic conductive adhesives may include conductive particles. The conductive particles may reduce current resistance upon electrical connection, e.g., between electrodes. Further, the conductive particles may satisfy the high voltage and high current properties desired when forming connection electrodes in a fine pitch and/or when forming a circuit connecting structure including connection electrodes in a fine pitch.

The anisotropic conductive adhesives may have conductive particles dispersed in a binder, e.g., an organic binder and/or a dielectric binder. When realizing a connection between electrodes and/or terminals, e.g., a connection between a connection substrate and a target substrate or semiconductor chip, the target substrate or the semiconductor chip may be aligned to an electrode or terminal on the connection substrate. The anisotropic conductive adhesive may be previously attached to the electrode or terminal on the connection substrate before the target substrate or semiconductor chip is aligned therewith. After realizing a connection between electrodes and/or terminals, the binder in the anisotropic conductive adhesive may dried or cured, e.g., by subjecting the anisotropic conductive adhesive to pressure and/or heat. According to an exemplary embodiment, the conductive particles in the dried or cured anisotropic conductive adhesive, i.e., the treated anisotropic conductive film, may be compressed between the electrodes to connect the electrodes together. The conductive particles pressed between electrodes in the treated anisotropic conductive film may be deformed and may provide electrical paths between the electrodes. For example, electrical current may flow in between the facing electrodes. An exemplary embodiment may include a cured binder insulator that maintains insulation between adjacent electrodes and/or terminals, such that the electrical current substantially only flows in a direction between surfaces of the electrodes that face each other, while adjacent electrodes are insulated from each other in other directions.

An exemplary anisotropic conductive adhesive may include conductive particles. The conductive particles may include copper core particles and metal coating layers coated on surfaces of corresponding copper core particles. The metal coating layer may be, e.g., a silver coating layer. The metal coating layer may be formed by coating the copper core particles with a metal. The metal may be selected to correspond with a material included in at least one of the elements, e.g., electrodes, that are to be connected using the anisotropic conductive adhesive. For example, if the material of at least one of electrodes is tin (Sn), the copper core particles may also be coated with tin; if the material of at least one of the electrodes is gold (Au), the copper core particles may also be coated with gold; and if the material of at least one of the electrodes is titanium (Ti), the copper core particles may also be coated with titanium.

Figure 2:
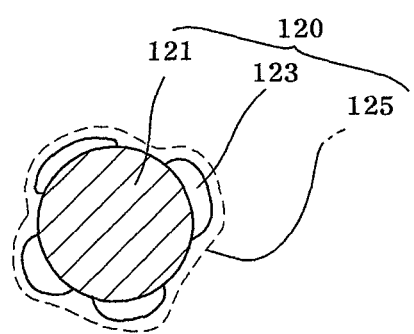
FIG. 2 illustrates a conductive particle of an anisotropic conductive material, according to an exemplary embodiment.
Figure 3:
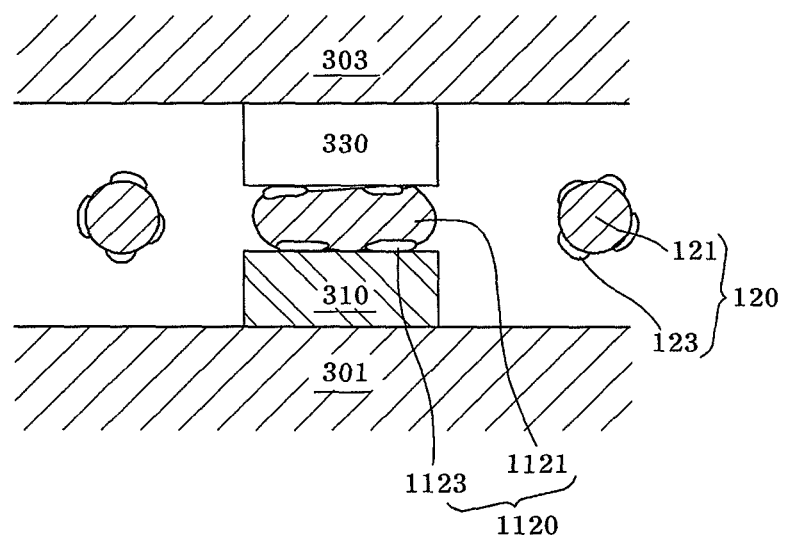
FIG. 3 illustrates a circuit connecting structure including an anisotropic conductive film, according to an exemplary embodiment.

FIG. 1 illustrates an anisotropic conductive material, e.g., an anisotropic conductive adhesive composite, paste, or film, in accordance with an exemplary embodiment. FIG. 2 illustrates a conductive particle for an anisotropic conductive material in accordance with an exemplary embodiment. FIG. 3 illustrates a circuit connecting structure including an anisotropic conductive film in accordance with one exemplary embodiment.

Referring to FIG. 1, the anisotropic conductive material 100 may be in the form of a composite, a paste, or a film. In addition, the anisotropic conductive composite may be realized in the form of an anisotropic conductive paste or film. The anisotropic conductive material 100, according to an exemplary embodiment, may include a binder 110 and conductive particles 120 dispersed in the binder 110. In the anisotropic conductive material 100, the binder 110 may be added in an amount of about 80 wt % to about 99.9 wt %. The weight percentage of the amount of binder may be based on the total weight of the conductive adhesive material 100 before the conductive material 100 is treated, e.g., cured or dried. The range of about 80 wt % to about 99.9 wt % represents a broad range for the amount of binder 110. As such, the range for the amount of binder 110 may also be encompassed by a narrower range that includes, but is not limited to, about 80 wt % to about 95 wt %, about 85 wt % to about 90 wt %, and 90 wt % to about 95 wt %.

The binder 110 may include at least one of a thermoplastic resin, a thermosetting resin, and a photocurable resin. The binder 100 may include at least one polymer resin of at least one of a thermoplastic resin, a thermosetting resin, and a photocurable resin. Examples of the polymer resin for the binder 100 include, but are not limited to, acrylonitrile resins, styrene-acrylonitrile resins, methyl methacrylate-butadiene-styrene resins, butadiene resins, styrene-butadiene resins, styrene resins, olefin resins, ethylene-vinyl resins, acrylonitrile-butadiene rubber, silicone resins, acrylic resins, epoxy resins, urethane resins, phenol resins, amide resins, and acrylate resins. The polymer resins may be used alone or in a combination of two or more in the binder 100.

The conductive particles 120 may be added in an amount of about 0.1 wt % to about 20 wt %. The range of about 0.1 wt % to about 20 wt % represents a broad range for the amount of conductive particles 120. The amount of conductive particles is not particularly limited and may be adjusted in accordance with a pitch of the elements, e.g., electrodes, to be connected. The range for the amount of conductive particles 120 may also be encompassed by a narrower range that includes, but is not limited to, about 1 wt % to about 10 wt %, about 5 wt % to about 15 wt %, and about 10 wt % to about 20 wt %.

The anisotropic conductive material 100 may include one or more additives, e.g., a silane coupling agent, a polymerization inhibitor, an anti-oxidant, a heat stabilizer, etc. These additives may be used alone or in a combination of two or more kinds.

Referring to FIG. 2, at least one conductive particle 120 may have a copper core particle 121. The copper core particle 121 may have coated thereon a metal coating layer 123, e.g., the metal coating layer 123 may be coated directly on a surface of the copper core particles 121. The metal coating layers 123 may be formed on the copper core particles 121 by, e.g., electroless plating. The copper core particles 121 may be formed through, e.g., atomization or chemical precipitation.

According to an exemplary embodiment, when the connection electrodes are formed in a fine pitch, the metal coating layer 123 may be a silver coating layer. The silver coating layer may have very low electrical resistance and may realize relatively high conductivity and high current density. A metal coating layer 123 that includes a silver coating layer may be coated on, e.g., directly on, the surface of a corresponding copper core particle 121. The metal coating layers 123 may have an island shape that exposes portions of the surfaces of the copper core particles 121. For example, the metal coating layer 123 may be formed in a plurality of segments on the surface of the corresponding copper core particle 121, such that the segments of the metal coating layer 123 are spaced apart from adjacent segments on the cooper core particle 121. The metal coating layer 123 may be formed as a continuous layer including a plurality of openings exposing the surface of the corresponding copper core particle 121. The metal coating layer 123 may include a combination of segments and continuous layers including openings. The metal coating layer 123 may be a single layer, e.g., a single silver coating layer, or may include a plurality of layers. At least one of the plurality of layers may be a silver coating layer.

The copper core particles 121 and the metal coating layers 123 including the silver coating layers may provide a relatively strong coupling force at interfaces therebetween due to, e.g., the good cohesion between copper and silver, as compared with a combination of a polymer core and other metal coating layers. As a result, when the conductive adhesive composite or film is subjected to pressure for connection of the electrodes and/or terminals, the metal coating layers 123 including the silver coating layers may effectively remain attached to the copper core particles 121, e.g., may not be separated from the copper core particles 121 upon compression. Accordingly, reliability of the electrode connection may be improved.

The metal coating layer 123 may be coated in a range of about 8 parts to about 9 parts based on the weight of the copper core particle 121. For example, the silver coating layer may be including in an amount of about 8 wt % to about 9 wt % based on a total weight of the conductive particles 120. For example, the copper core particles 121 and the metal coating layer 123 may have a weight ratio of about 9:1. According to an exemplary embodiment, an amount of silver for the metal coating layer 123 may be less than in the case where a large amount of gold is used to form a gold coating layer on polymer core particles. Thus, it may be relatively easier to coat the metal coating layer 123 that includes silver on the copper core particle 121.

The copper core particles 121 may be formed through, e.g., atomization or chemical precipitation. When using chemical precipitation to form the copper core particles 121, a relatively uniform particle size distribution and relatively the same spherical shape may be obtained. Further, copper may have a relatively lower level of hardness than, e.g., nickel. As such, the copper core particles 121 of the conductive particles 120 may be deformed from a spherical shape to, e.g., an oval or plate shape, during compression for connection, e.g., of electrodes. For example, spherical shaped conductive particles 120 having a substantially equal height and width may be deformed into an irregular shape having a greater width than height. Even in the case of non-uniform particle size distribution, the deformed copper core particles 121 may enable reliable connection between connected elements, e.g., electrodes.

When the copper core particles 121 have a uniform shape, e.g., a spherical shape, it may be easier to adjust the density of the metal thereon, e.g., the density of silver on the copper core particles 121. According to an exemplary embodiment, the irregular copper particles may be excluded during the process of coating the silver on the copper core particles 121. As such, the metal coating layers 123 may be provided on copper core particles 121 having a uniform shape, and the density of the silver may be more easily adjusted to be, e.g., more uniform.

The conductive particles 120 including the copper core particles 121 and the metal coating layer 123 may have an average particle size of about 2 to about 20 µm. The conductive particles 120 may have an average particle size of about 5 to about 10 µm suited for use with, e.g., electrodes having a fine pitch. The range of about 2 to about 20 µm for particle size represents a broad range, and the particle size of the conductive particles 120 may be encompassed by a narrower range that includes, but is not limited to, about 2 to about 15 µm, about 5 to about 10 µm, and about 10 to about 15 µm. Without intending to be bound by this theory, if the average particle size is less than about 2 µm, the possibility of connection failure may increase depending on, e.g., the degree of roughness on an electrode surface upon compression for connection. If the average particle size is greater than about 20 µm, the possibility of short circuit between connected elements, e.g., the electrodes, may increase.

After preparing the conductive particles 120 including the copper core particles 121 and the metal coating layer 123, the surface of the conductive particles 120 may be subjected to a rust or oxidation protection treatment. The rust protection treatment may maintain a cleaner surface state. The rust protection treatment may reduce and/or prevent the formation of foreign matter on the conductive particles 120. The rust protection treatment may be performed using an organic material, e.g., stearic acid, to form a rust protection layer 125 on the surface of the conductive particles 120. Accordingly, stearic acid may be a reactant in the formation of the rust protection layer 125.

Referring to FIG. 3, according to an exemplary embodiment, a circuit connecting structure may include the anisotropic conductive composite or film. The circuit connecting structure may include a wire substrate 301 having a wire electrode 310, e.g., a lead, formed thereon. The circuit connecting structure may include a circuit substrate 303 having a circuit electrode 330, e.g., a bump or pad, formed thereon. An anisotropic conductive composite or film may be disposed between the wire electrodes 310 and the circuit substrate 303 in order to connect the wire electrode 310 and the circuit electrode 330 to each other. The circuit electrode 330 may be, e.g., a connection pad or connection terminal for a semiconductor chip, a drive chip for a display panel, mobile phone, handheld display unit, and the like. The wire electrode 310 may be, e.g., a lead or an electrode terminal of a display panel.

According to an exemplary embodiment, when the wire electrode 310 is attached to one side of at least one conductive particle 120 in an anisotropic conductive composite or film, the circuit electrode 330 may be aligned with the wire electrode 310 and attached to an opposing side of the at least one conductive particle 120. As shown in FIG. 3, when the conductive particles 120 are compressed between the wire electrode 310 and the circuit electrode 330, deformed conductive particles 1120 between the wire electrode 310 and the circuit electrode 330 may be formed. For example, the copper core particles 1121 may be deformed from a spherical shape into, e.g., an oval shape or plate shape during compression. Since copper has relatively low hardness and is more ductile than, e.g., nickel, the copper particles 1121 may be comparatively readily deformed upon compression.

The deformation of the copper core particles 1121 may lead to higher reliability of electrical connection between the wire electrode 310 and the circuit electrode 330. For example, electrical connection may be enabled even in the case where the wire electrode 310 and the circuit electrode 330 are separated by a non-uniform distance from each other due to, e.g., non-uniform heights of the wire electrode 310 or circuit electrode 330. Further, even in the case of low surface flatness of the wire electrode 310 or circuit electrode 330, it may be possible to compress the conductive particles 1120 for a relatively reliable electrical connection. The wire electrode 310 and the circuit electrode 330 may be brought into close contact with each other through the deformation of the copper core particles 1121. As the degree of contact increases between the wire electrode 310 and the circuit electrode 330, e.g., resulting from the deformation of the copper core particles 1121, the conductive particles 1120 may be forced between other electrodes that are separated by a relatively wide distance from each other, and electrical connection may be allowed therebetween.

The deformation of the copper core particles 1121 may readily occur upon compression. As such, denting or other forms of damage to the wire electrode 310 and/or the circuit electrode 330 by the conductive particles 1120 may be effectively suppressed. The wire electrode 310 formed of, e.g., copper, may exhibit good adhesion to the copper core particles 1121 and/or metal coating layers 1123. The wire electrode 310 formed of copper may have a similar hardness as to the copper core particles 1121 and/or metal coating layers 1123, so that damage to the wire electrode 310 by the conductive particles 1120 may be reduced and/or prevented. Further, the wire electrode 310 formed of, e.g., silver or gold may exhibit good adhesion to the metal coating layers 1123, e.g., metal coating layers 1123 including silver coating layers, on the surface of the conductive particles 1120, thereby strong cohesion between the wire electrode and the conductive particles may be realized. Accordingly, it may be possible to improve connection strength and reliability.

If the wire electrode 310 and the circuit electrode 330 are formed of different materials, e.g., copper and silver (or gold), the anisotropic conductive material 100 may exhibit relatively high cohesion and adhesion both to the wire electrode 310 and the circuit electrode 330 formed of the different materials. For example, the metal coating layer 1123, e.g., including a silver coating layer, may be formed in the island shape on the surface of the corresponding copper core particle 1121 through, e.g., electroless plating. The metal coating layer 1123 may expose partial portions of the surface of the copper core particle 1121. According to an exemplary embodiment, the copper core particles 1121 may be primarily adhered to the wire electrode 310 made of copper, and the metal coating layer 1123 including a silver coating layer, may be primarily adhered to the circuit electrode 330 made of silver. This arrangement may improve connection reliability between the wire electrode 310 and the circuit electrode 330.

According to an exemplary embodiment, if the circuit electrode 330 is made of a material including, e.g., tin (Sn), gold (Au), titanium (Ti), bismuth (Bi), aluminum (Al) or molybdenum (Mo), the metal coating layer 123 may be formed by coating the conductive particles with the corresponding or same materials as that of the circuit electrode 330. The metal coating layer 123 may be formed of the corresponding or same material as that of the circuit electrode 330. Thus, strong adhesion between the metal coating layer 123 and the circuit electrode 330 may be realized, thereby improving connection reliability, current properties, and current resistance.

Next, the exemplary embodiments will be described in more detail with reference to examples, but it should be understood that these examples are provided by way of illustration only and do not limit the scope of the embodiments.

Examples

Exemplary anisotropic conductive composites and films of Examples 1-3 and Comparative Examples 1-4 were prepared according to the following compositions.

Binder

The binder includes bisphenol acrylate (BPA)-based epoxy. The anisotropic conductive composite includes about 20 wt % of the bisphenol acrylate (BPA)-based epoxy based on about 100 wt %, i.e., total weight, of the anisotropic conductive composite. The BPA-based epoxy in the Examples was YD128 (Kukdo Chemical Industry Co. Ltd., Korea).

The binder also includes naphthalene-based epoxy. The anisotropic conductive composite includes about 10 wt % of the naphthalene-based epoxy based on about 100 wt %, i.e., total weight, of the anisotropic conductive composite. The naphthalene-based epoxy was added in a ratio of about 1:2 with respect to the BPA-based epoxy. The naphthalene-based epoxy in the Examples was HP4032D (Dai Nippon Ink Chemical Industry Co., Ltd., Japan).

The binder further includes acryl rubber. The anisotropic conductive composite includes about 20 wt % of the acryl rubber based on 100 wt %, i.e., total weight, of the anisotropic conductive composite. The acryl rubber includes an acrylate copolymer and is added in a ratio of about 2:3 with respect to the total amount of epoxy, i.e., the amount of Bisphenol acrylate (BPA)-based epoxy and Naphthalene-based epoxy. The acryl rubber in the Examples was SG-P3-TEA (Nagase Chem. Techs. Co., Ltd., Japan).

Curing Agent

HX3922HP (Asahi Kasei Co., Ltd., Japan), which is a micro-capsule type curing agent, is added to the anisotropic conductive composite as a curing agent. The anisotropic conductive composite includes about 25 wt % of the curing agent based on 100 wt %, i.e., total weight, of the anisotropic conductive composite.

Silane Coupling Agent

KBM403 (Shin-Etsu Co., Ltd., JP) is added to the anisotropic conductive composite as a silane coupling agent. The anisotropic conductive composite includes about 2 wt % of the silane coupling agent based on 100 wt %, i.e., total weight, of the anisotropic conductive composite.

Conductive Particles

Metal particles (from Dowa Co., Ltd., Japan) of the Examples 1-3 were conductive particles that include Cu and Ag and were processed using electroless plating such that the Cu and Ag content was in a weight ratio of 9:1. Conductive particles of Comparative Example 1 were formed by coating polymer particles having a particle size of 5 μm with nickel/gold (Ni/Au), conductive particles of Comparative Example 2 were formed by coating nickel particles having a particle size of 5 μm with gold (Au), conductive particles of Comparative Example 3 were formed by coating nickel particles having a particle size of 8 μm with gold (Au), and conductive particles of Comparative Example 4 were nickel particles having a particle size of 5 μm. The anisotropic conductive includes about 10 wt % of the conductive particles based on 100 wt %, i.e., total weight, of the anisotropic conductive composite.

Rust Protection Treatment

Rust protection treatment was performed on Examples 1 and 2 using stearic acid (available from Sigma Aldrich Corporation).

TABLE 1

Characteristics of the conductive particles

| | Particle Size (μm) | Core Material | Coating Material | Rust Protection Yes/No |
|---|---|---|---|---|
| Example 1 | 7 | Copper | silver | Yes |
| Example 2 | 5 | Copper | silver | Yes |
| Example 3 | 5 | Copper | silver | No |
| Comparative Example 1 | 5 | Polymer | Ni/Au | No |
| Comparative Example 2 | 5 | Nickel | Gold | No |
| Comparative Example 3 | 8 | Nickel | Gold | No |
| Comparative Example 4 | 5 | Nickel | — | No |

Anisotropic conductive films including anisotropic conductive composites were prepared using the conductive particles of Examples 1-3 and Comparative Examples 1-4 shown in Table 1. The conductive particles of Table 1 were each mixed with the solution including the Bisphenol acrylate (BPA)-based epoxy, the Naphthalene-based epoxy, the acryl rubber, the curing agent, and the silane coupling agent discussed above, and stirred until a uniform mixture was obtained. The mixture of the solution including the binder and the conductive particles was coating on a substrate and dried to form an anisotropic conductive film. Anisotropic conductive films according to exemplary embodiments may have a uniform thickness within a range of about 20 to about 40 μm.

For evaluation of the properties of the resulting films, each of the anisotropic conductive films of Examples 1-3 and Comparative Examples 1-4 were temporarily compressed onto a glass substrate including a silver pattern for electrodes printed thereon. The anisotropic conductive films had heat and pressure applied thereon to compress the anisotropic conductive films.

For evaluation of connection between electrodes, i.e., the electrical conductivity between the electrodes, a 200-micron pitch test contact probe was used as a measurement terminal. Resistance of the anisotropic conductive films was measured using a 4-point probe technique. Further, insulation of the anisotropic conductive films was evaluated using a 2-point probe technique. When the resistance was 109 ohm (Ω) or more, it was determined that the anisotropic conductive film provides good insulation, e.g., poor electrical conductivity. After thermal compression of the conductive film, the connection and the insulation properties of the anisotropic conductive films were evaluated at room temperature. Then, the anisotropic conductive films were maintained, for predetermined periods of time, at a temperature of 85° C. and a relative humidity of 85%, and the connection and insulation properties of the anisotropic conductive films were evaluated again at room temperature.

TABLE 2

Measurement results of connection resistance in a high temperature high humidity atmosphere over a period of time

| Unit (Ω) | Initial connection resistance | 85° C./85%, 500 hours | 85° C./85%, 750 hours |
|---|---|---|---|
| Example 1 | 0.40 | 0.41 | 0.41 |
| Example 2 | 0.40 | 0.41 | 0.41 |
| Example 3 | 0.52 | 0.54 | 0.54 |
| Comparative Example 1 | 0.50 | 1.80 | 1.82 |
| Comparative Example 2 | 0.50 | 0.54 | 0.63 |
| Comparative Example 3 | 0.51 | 0.53 | 0.75 |
| Comparative Example 4 | 0.55 | 3.18 | 3.80 |

Table 2 shows the measurement results of connection resistance. In the insulation evaluation test, it was determined that all of Examples 1-3 and Comparative Examples 1-4 exhibited relatively low initial connection resistance. The results of Table 2 show that when the comparative examples were exposed to a high temperature and high humidity atmosphere for a long period of time, the comparative examples suffered an increase in connection resistance. For example, Comparative Examples 1 and 4 suffered a rapid increase in connection resistance. In contrast, in Examples 1 to 3, the resistance increase was effectively suppressed even upon exposure to a high temperature and high humidity atmosphere for a long period of time.

Further, reliability of the anisotropic conductive films was evaluated by measuring resistance of the anisotropic conductive film after leaving the anisotropic conductive films under conditions of 1.2 atm, 100° C., and 100% humidity in a pressure cooker test (PCT). Table 3 shows connection resistance by results measured through the pressure cooker test.

TABLE 3

Measurement results of connection resistance in pressure cooker test

| Unit (Ω) | Initial connection resistance | PCT 36 hours | PCT 72 hours |
|---|---|---|---|
| Example 1 | 0.40 | 0.41 | 0.41 |
| Example 2 | 0.40 | 0.41 | 0.41 |
| Example 3 | 0.52 | 0.54 | 0.55 |
| Comparative Example 1 | 0.50 | 0.90 | 1.10 |
| Comparative Example 2 | 0.50 | 0.51 | 1.40 |
| Comparative Example 3 | 0.51 | 0.53 | 2.50 |
| Comparative Example 4 | 0.55 | 2.60 | 3.10 |

The results of Table 3 show that when the Comparative Examples 1-4 were exposed to a high pressure, high temperature, and high humidity atmosphere for a long period of time. Comparative Examples 1-4 suffered an increase in connection resistance over the period of time. For examples, Comparative Examples 1 and 4 suffered a rapid increase in resistance. In contrast, in Examples 1-3, the resistance increase was effectively suppressed even upon exposure to a high pressure, high temperature, and high humidity atmosphere for a long period of time. Thus, Examples 1 to 3 may realize higher reliability.

By way of summation and review, there has been an increase in demand for electrical circuit connection between electrodes formed in a fine pattern. Since wires may be disposed in a fine pitch, connection electrodes are also formed in a fine pitch, thereby it may be difficult to secure low electrical resistance at a connection part. Moreover, since some devices, e.g., a plasma display panel, require high current properties, adhesives having low resistance and high current resistance are desired.

Anisotropic conductive composites, e.g., anisotropic conductive adhesive pastes and/or films, may be used for the connection of parts. The anisotropic conductive composites used may have low resistance and high current resistance to endure high current at the connection of parts, e.g., connection of electrodes. Exemplary embodiments provide an anisotropic conductive adhesive composite and film that include conductive particles. The conductive particles may improve electrical resistance upon connection, and may satisfy the high voltage and high current properties desired when forming connection electrodes in a fine pitch and/or when forming a circuit connecting structure including connection electrodes in a fine pitch.

When the conductive particles of the anisotropic conductive film are, e.g., gold plated resin particles or gold plated nickel particles, however, the conductive particles may deteriorate the conductivity of the anisotropic conductive film. For example, the gold plated layer of the resin particles may exhibit relatively weak adhesion to the surface of the resin particles. As such, the gold plated layer may become separated from a surface of a core resin particle and expose the surface of the core resin particle when pressure is applied for connection of the electrodes. Thus, the gold plated resin particles may deteriorate the conductivity of the anisotropic conductive film.

Further, the gold plated nickel particles may be formed using relatively complicated surface treatment and large amounts of gold to cover the entire surface of the core resin particles with gold. Moreover, when force is applied to connect the electrodes, the soft core of the resin particles may be cracked. The gold plated nickel particles may also exhibit relatively weak adhesion of the gold coated layer to the surface of the core nickel particles. Therefore, the gold plated layer may become separated from the surface of core nickel particles upon compression. Thus, the gold plated nickel particles may deteriorate the conductivity of the anisotropic conductive film. Further, the core nickel particles may have a relatively high hardness. As such, the core nickel particles may have limited flexibility, and may be dented and/or damaged upon compression, e.g., when the connection electrodes include metal layers having relatively low hardness, such as copper (Cu) or silver (Ag).

In addition, the core nickel particles themselves may not be easily deformed upon compression. As such, it may be difficult for smaller particles to contact the electrodes and provide a current path therebetween, e.g., when there is a difference in particle size between the core nickel particles. For example, the surface of the substrate to be bonded to the anisotropic conductive film may have a poor flatness due to irregular heights of the electrodes. Further, difficulty in deformation of the nickel particles upon compression may lead to a failure, e.g., a short circuit, between the electrodes resulting from deterioration of connection therebetween. Further, the inherently high resistance of the core nickel particles may make the nickel particles unsuitable for application to fine pitch electrodes that require high current properties. In other words, it may be difficult to decrease resistance upon connecting electrodes having a fine pitch, and gold plated resin particles or gold plated nickel particles may not reduce the resistance. By contrast, embodiments provide conductive particles, e.g., particles including a copper core particle and a silver metal coating layer thereon, that may provide a relatively strong coupling force at interfaces therebetween.

Exemplary embodiments have been disclosed herein, and although specific terms are employed, they are used and are to be interpreted in a generic and descriptive sense only and not for purpose of limitation. Embodiments have been provided to illustrate the invention in conjunction with the drawings, it will be apparent to those skilled in the art that the embodiments are given by way of illustration only, and that various modifications, changes, and alterations can be made without departing from the spirit and scope of the present invention. Accordingly, it will be understood by those of ordinary skill in the art that various changes in form and details may be made without departing from the spirit and scope of the present invention as set forth in the following claims.

What is claimed is:

1. An anisotropic conductive film, comprising:
   a binder; and
   conductive particles dispersed in the binder, each of the conductive particles including a copper core particle having silver metal directly contacting copper metal of the copper core particle, the silver metal being in a silver coating layer coated directly on a surface of the copper core particle, the silver coating layer having an island shape that exposes portions of the surface of the copper core particle and that covers other portions of the surface of the copper core particle,
   wherein the conductive particles have an average particle size ranging from about 2 to about 20 µm.

2. The anisotropic conductive film as claimed in claim 1, wherein:
   the binder includes an organic resin, an amount of the organic resin being about 99.9 to 80 wt % based on a total weight of the anisotropic conductive film, and
   an amount of the conductive particles is about 0.1 to 20 wt % based on the total weight of the anisotropic conductive film.

3. The anisotropic conductive film as claimed in claim 1, wherein a total amount of the silver coating layer is about 8 wt % to about 9 wt % based on a total weight of the conductive particles.

4. The anisotropic conductive film as claimed in claim 1, wherein the copper core particle is formed by chemical precipitation.

5. The anisotropic conductive film as claimed in claim 1, wherein the copper core particle is formed by atomizing.

6. The anisotropic conductive film as claimed in claim 1, wherein each of the conductive particles includes a rust protection layer directly on the exposed portions of the surface of the copper core particle and directly on a surface of the silver coating layer that covers the other portions of the surface of the copper core particle, the rust protection layer being formed by a rust protection treatment including stearic acid.

7. An anisotropic conductive adhesive composite, comprising:
   a binder; and
   conductive particles dispersed in the binder, each of the conductive particles including a copper core particle having silver metal directly contacting copper metal of the copper core particle, the silver metal being in a silver coating layer coated directly on a surface of the copper core particle, the silver coating layer having an island shape that exposes portions of the surface of the copper core particle and that covers other portions of the surface of the copper core particle,
   wherein the conductive particles have an average particle size ranging from about 2 to about 20 µm.

8. The anisotropic conductive adhesive composite as claimed in claim 7, wherein each of the conductive particles includes a rust protection layer directly on the exposed portions of the surface of the copper core particle and directly on a surface of the silver coating layer that covers the other portions of the surface of the copper core particle, the rust protection layer being formed by a rust protection treatment including stearic acid.

9. The anisotropic conductive adhesive composite as claimed in claim 7, the island shape being formed through electroless plating.

10. The anisotropic conductive adhesive composite as claimed in claim 9, wherein a total amount of the silver coating layer is about 8 wt % to about 9 wt % based on a total weight of the conductive particles.

11. A circuit connection structure, comprising:
 a circuit substrate including a circuit electrode;
 a wire substrate facing the circuit substrate and including a wire electrode; and
 an anisotropic conductive film as claimed in claim 1, the anisotropic conductive film being configured to provide an electrical connection between the circuit electrode and the wire electrode.

12. The circuit connection structure as claimed in claim 11, wherein the wire electrode includes copper corresponding to the copper core particle.

13. The circuit connection structure as claimed in claim 11, wherein the circuit electrode includes silver (Ag), tin (Sn), gold (Au), titanium (Ti), molybdenum (Mo), aluminum (Al) or bismuth (Bi) corresponding to the metal coating layer, and the metal coating layer includes silver (Ag), tin (Sn), gold (Au), titanium (Ti), molybdenum (Mo), aluminum (Al) or bismuth (Bi) corresponding to the circuit electrode.

14. The circuit connection structure as claimed in claim 11, wherein the wire electrode includes copper, and the circuit electrode includes silver, such that at least one copper core particle is adhered to the wire electrode and at least one silver coating layer is adhered to the circuit electrode.

15. The circuit connection structure as claimed in claim 11, wherein a total amount of the silver in the silver coating layer is about 8 wt % to about 9 wt % based on a total weight of the conductive particles.

16. The circuit connection structure as claimed in claim 11, wherein at least one conductive particle is disposed between the circuit electrode and the wire electrode, and the copper core particle of the at least one conductive particle is deformed.

17. The anisotropic conductive adhesive composite as claimed in claim 7, wherein each of the conductive particles includes a rust protection layer directly on the exposed portions of the surface of the copper core particle and directly on a surface of the silver coating layer that covers the other portions of the surface of the copper core particle, the rust protection layer being formed by a rust protection treatment including using an organic material as a reactant to form the rust protection layer.

18. The anisotropic conductive adhesive composite as claimed in claim 7, wherein the binder is included in an amount of about 99.9 to 80 wt %, based on a total weight of the anisotropic conductive adhesive composite.

19. The circuit connection structure as claimed in claim 11, wherein the silver coating layer consists essentially of silver.

* * * * *